(12) United States Patent
Shibata

(10) Patent No.: US 10,998,287 B2
(45) Date of Patent: May 4, 2021

(54) SEMICONDUCTOR DEVICE AND METHOD OF MANUFACTURING THE SAME

(71) Applicant: Toshiba Memory Corporation, Minato-ku (JP)

(72) Inventor: Junichi Shibata, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/541,398

(22) Filed: Aug. 15, 2019

(65) Prior Publication Data

US 2020/0294958 A1    Sep. 17, 2020

(30) Foreign Application Priority Data

Mar. 15, 2019    (JP) .............................. JP2019-049055

(51) Int. Cl.
*H01L 25/18*    (2006.01)
*H01L 23/00*    (2006.01)
*H01L 25/065*    (2006.01)
*H01L 25/00*    (2006.01)

(52) U.S. Cl.
CPC .............. *H01L 24/80* (2013.01); *H01L 24/08* (2013.01); *H01L 25/0657* (2013.01); *H01L 25/18* (2013.01); *H01L 25/50* (2013.01); *H01L 2224/08145* (2013.01); *H01L 2224/8002* (2013.01); *H01L 2224/80895* (2013.01); *H01L 2225/06524* (2013.01); *H01L 2924/1431* (2013.01); *H01L 2924/14511* (2013.01)

(58) Field of Classification Search
CPC ..... H01L 24/80; H01L 25/18; H01L 25/0657; H01L 25/50; H01L 24/08; H01L 2924/1431; H01L 2224/08145; H01L 2224/8002; H01L 2224/80895; H01L 2924/14511; H01L 2225/06524; H01L 2225/06513
See application file for complete search history.

(56) References Cited

U.S. PATENT DOCUMENTS

| | | | |
|---|---|---|---|
| 6,404,047 B1 | 6/2002 | Haley et al. | |
| 9,558,945 B2 | 1/2017 | Fukuzumi et al. | |
| 9,786,628 B2* | 10/2017 | Chou | ............. H01L 21/764 |
| 10,068,876 B2* | 9/2018 | Kabe | ............. H01L 23/5329 |
| 2016/0268158 A1 | 9/2016 | Leobandung | |
| 2016/0358882 A1 | 12/2016 | Liu et al. | |

FOREIGN PATENT DOCUMENTS

JP    2016-062901 A    4/2016

* cited by examiner

*Primary Examiner* — Matthew L Reames
(74) *Attorney, Agent, or Firm* — Oblon, McClelland, Maier & Neustadt, L.L.P.

(57) ABSTRACT

In one embodiment, a semiconductor device includes a first wafer or a first chip including a first insulator and a first pad. The device further includes a second wafer or a second chip including a second insulator in contact with the first insulator, and a second pad opposed to the first pad and electrically connected to the first pad. Moreover, the first insulator includes a first trench extending to the first pad, and/or the second insulator includes a second trench extending to the second pad.

15 Claims, 15 Drawing Sheets

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-049055, filed on Mar. 15, 2019, the entire contents of which are incorporated herein by reference.

FIELD

Embodiments described herein relate to a semiconductor device and a method of manufacturing the same.

BACKGROUND

When a semiconductor device is manufactured by bonding a wafer to another wafer, there is demand to electrically connect pads of these wafers with each other in a suitable form.

DETAILED DESCRIPTION

Figure 1:
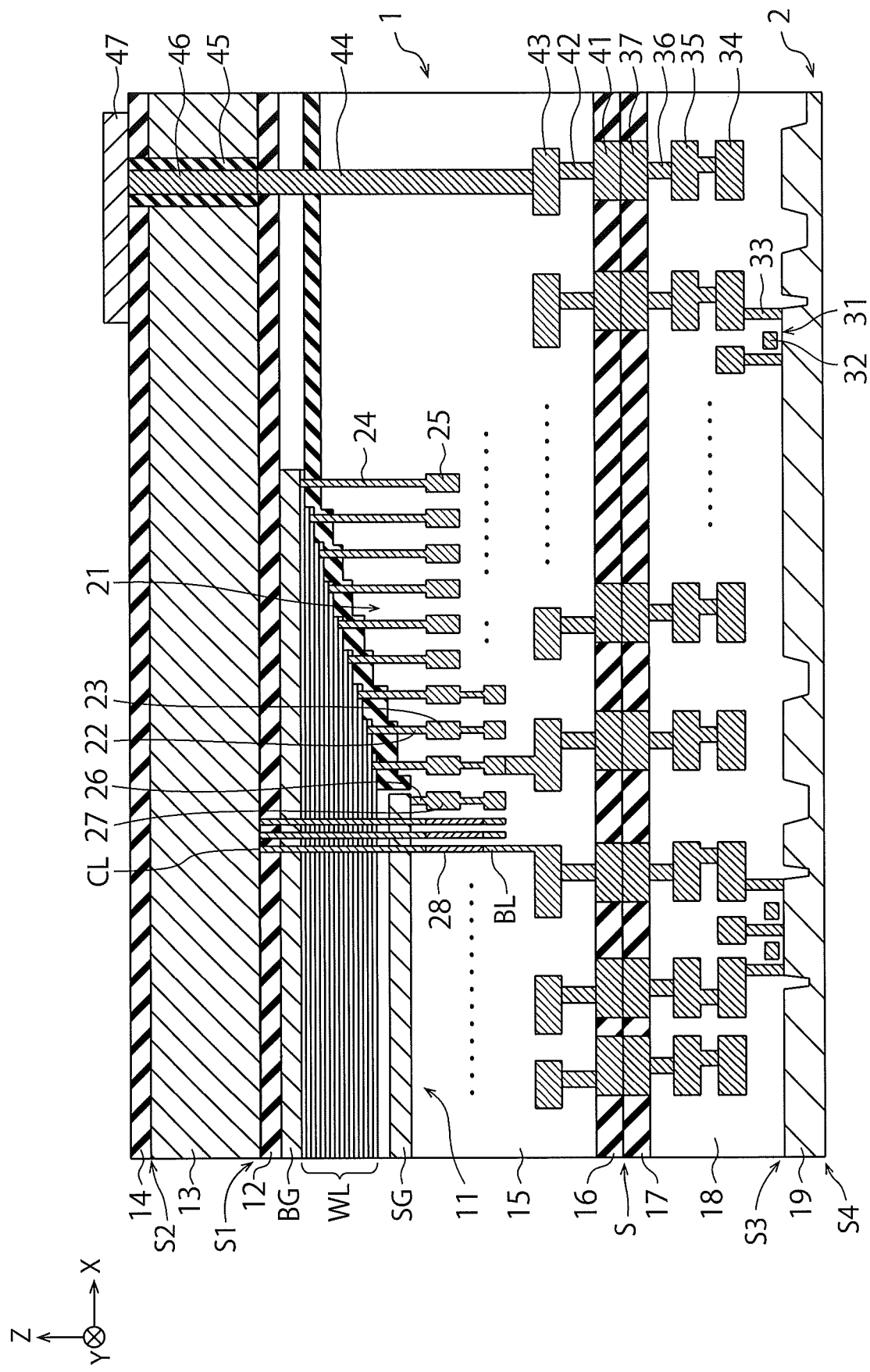
FIG. 1 is a sectional view showing a structure of a semiconductor device of a first embodiment.

In one embodiment, a semiconductor device includes a first wafer or a first chip including a first insulator and a first pad. The device further includes a second wafer or a second chip including a second insulator in contact with the first insulator, and a second pad opposed to the first pad and electrically connected to the first pad. Moreover, the first insulator includes a first trench extending to the first pad, and/or the second insulator includes a second trench extending to the second pad.

Embodiments will now be explained with reference to the accompanying drawings. In FIGS. 1 to 17, same or similar components are denoted by the same reference numerals, and redundant description thereof will be omitted.

First Embodiment

FIG. 1 is a sectional view showing a structure of a semiconductor device of a first embodiment. The semiconductor device of FIG. 1 is a three-dimensional memory in which an array chip 1 is bonded to and a circuit chip 2.

The array chip 1 includes a memory cell array 11 including plural memory cells, an insulator 12 on the memory cell array 11, a substrate 13 on the insulator 12, and an insulator 14 on the substrate 13. The array chip 1 further includes an inter layer dielectric 15 under the memory cell array 11, and an insulator 16 under the inter layer dielectric 15. The insulators 12, 14, and 16 are, for example, silicon oxide films or silicon nitride films. The substrate 13 is, for example, a semiconductor substrate such as a silicon substrate.

The circuit chip 2 is provided under the array chip 1. Reference character S denotes a bonding face between the array chip 1 and circuit chip 2. The circuit chip 2 includes an insulator 17, an inter layer dielectric 18 under the insulator 17, and a substrate 19 under the inter layer dielectric 18. The insulator 17 is, for example, a silicon oxide film or silicon nitride film. The substrate 19 is, for example, a semiconductor substrate such as a silicon substrate.

FIG. 1 shows an X direction and Y direction perpendicular to each other and parallel to surfaces S1 and S2 of the substrate 13 and surfaces S3 and S4 of the substrate 19 as well as shows a Z direction perpendicular to the surfaces S1 and S2 of the substrate 13 and surfaces S3 and S4 of the substrate 19. In the present specification, a +Z direction is treated as an upward direction and −Z direction is treated as a downward direction. For example, the memory cell array 11 is located above the substrate 19 and below the substrate 13. The −Z direction may or may not coincide with the gravity direction.

As an electrode layer in the memory cell array 11, the array chip 1 includes plural word lines WL, a back gate BG, and a selection gate SG. FIG. 1 shows a staircase structure 21 of the memory cell array 11. As shown in FIG. 1, each of the word lines WL is electrically connected with a word line layer 23 via a contact plug 22, the back gate BG is electrically connected with a back gate line layer 25 via a contact plug 24, and the selection gate SG is electrically connected with a drain-side selection gate line layer 27 via a contact plug 26. Each columnar portion CL penetrating the word lines WL, back gate BG, and selection gate SG is electrically connected with a bit line BL via a plug 28 and electrically connected with the substrate 13.

The circuit chip 2 includes plural transistors 31. The transistors 31 include respective gate electrodes 32 provided on the substrate 19 via gate insulators as well as non-illustrated source diffusion layers and drain diffusion layers provided in the substrate 19. The circuit chip 2 further includes plural plugs 33 provided on the source diffusion layers or drain diffusion layers of the transistors 31, a line (interconnect) layer 34 provided on the plugs 33 and including plural lines (interconnects), and a line layer 35 provided on the line layer 34 and including plural lines. The circuit chip 2 further includes plural via plugs 36 provided on the line layer 35 and plural metal pads 37 provided on the via plugs 36 in the insulator 17. The circuit chip 2 functions as a control circuit (logic circuit) adapted to control the array chip 1.

The array chip 1 includes plural metal pads 41 provided on the metal pads 37 in the insulator 16, plural via plugs 42 provided on the metal pads 41, and a line layer 43 provided on the via plugs 42 and containing plural lines. The word lines WL and bit lines BL are electrically connected with corresponding lines in the line layer 43. The array chip 1 further includes a plug 44 provided on the line layer 43 by passing through the inter layer dielectric 15 and insulator 12, a plug 46 provided on the plug 44 by passing through the substrate 13 and insulator 14 via an insulator 45, and a pad 47 provided on the insulator 14 and plug 46. The pad 47 is an external connection pad of the semiconductor device of FIG. 1 and is connectable to a mounted substrate or another device via a solder ball, metal bump, bonding wire, or the like.

Figure 2:
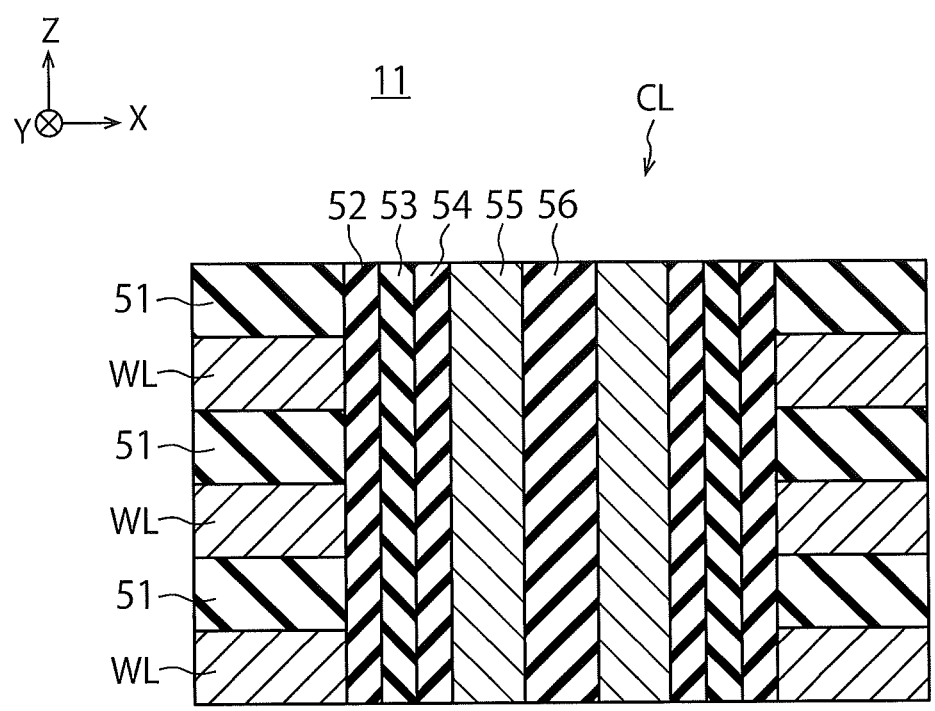
FIG. 2 is a sectional view showing a structure of a columnar portion of the first embodiment.

FIG. 2 is a sectional view showing a structure of the columnar portion CL of the first embodiment.

As shown in FIG. 2, the memory cell array 11 includes plural word lines WL and plural insulating layers 51 provided alternately on the inter layer dielectric 15 (FIG. 1). Each of the word lines WL is, for example, a W (tungsten) layer. Each of the insulating layers 51 is, for example, a silicon oxide film.

The columnar portion CL includes a block insulator 52, a charge storage layer 53, a tunnel insulator 54, a channel semiconductor layer 55, and a core insulator 56 in this order. The charge storage layer 53 is, for example, a silicon nitride film, and is formed on side faces of the word lines WL and insulating layers 51 via a block insulator 52. The channel semiconductor layer 55 is, for example, a polysilicon layer and is formed on a side face of the charge storage layer 53 via the tunnel insulator 54. The block insulator 52, tunnel insulator 54, and core insulator 56 are, for example, silicon oxide films or metal insulators.

Figure 3:
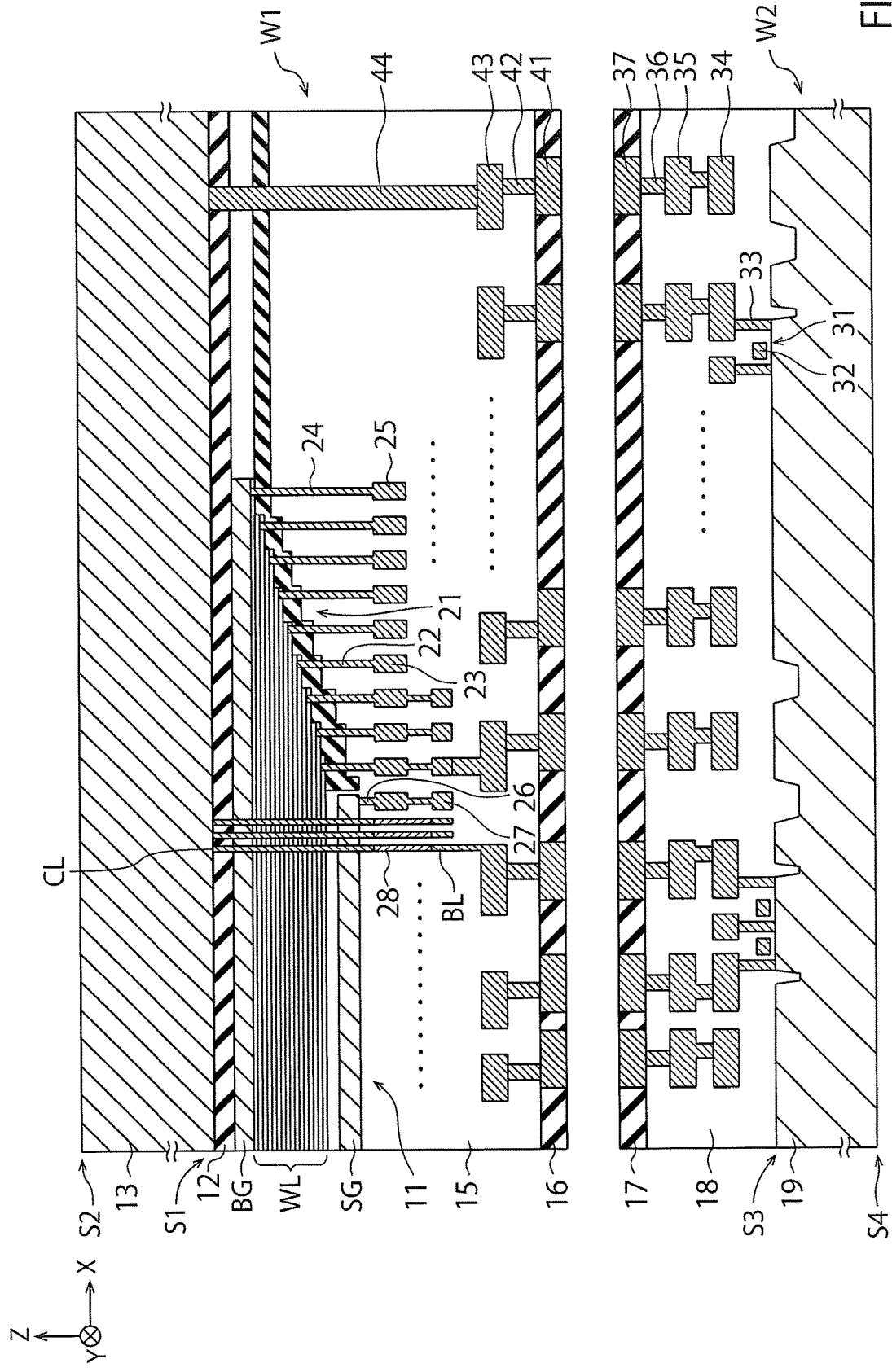
FIG. 3 is a sectional view showing a method of manufacturing the semiconductor device of the first embodiment.

FIG. 3 is a sectional view showing a method of manufacturing the semiconductor device of the first embodiment. FIG. 3 shows an array wafer W1 including plural array chips 1 and a circuit wafer W2 including plural circuit chips 2. The array wafer W1 is also called a memory wafer and the circuit wafer W2 is also called a CMOS wafer.

First, the array wafer W1 is bonded to the circuit wafer W2 by mechanical pressure. Consequently, the insulator 16 is adhered to the insulator 17. Next, the array wafer W1 and circuit wafer W2 are annealed at 400° C. Consequently, the metal pads 41 are joined to the metal pads 37. Examples of other methods for joining the metal pads 41 to the metal pads 37 will be described later.

Subsequently, the substrates 13 and 19 are thinned by CMP (Chemical Mechanical Polishing), and then the array wafer W1 and circuit wafer W2 are diced into plural chips. In this way, the semiconductor device of FIG. 1 is manufactured. The insulator 14, insulator 45, plug 46, and pad 47 are formed on or in the substrate 13, for example, after the thinning of the substrate 13.

Although the array wafer W1 is bonded to the circuit wafer W2 in the present embodiment, the array wafer W1 may be bonded to another array wafer W1 instead. The description given above with reference to FIGS. 1 to 3 and description to be given later with reference to FIGS. 4A to 17 are also applicable to bonding between array wafers W1.

Also, while FIG. 1 shows a boundary face between the insulator 16 and insulator 17 as well as a boundary face between the metal pads 41 and metal pads 37, generally these boundary faces become unobservable after the annealing. However, locations where the boundary faces existed can be estimated by detecting, for example, inclinations of side faces of the metal pads 41 and side faces of the metal pads 37 or displacement between the side faces of the metal pads 41 and the metal pads 37.

Although in FIGS. 1 and 3, the insulator 16 is formed on a lower face of the inter layer dielectric 15, the insulator 16 may be included in and integrated with the inter layer dielectric 15. Similarly, although in FIGS. 1 and 3, the insulator 17 is formed on an upper face of the inter layer dielectric 18, the insulator 17 may be included in and integrated with the inter layer dielectric 18. In FIGS. 4A to 17 described later, because the insulator 16 is included in and integrated with the inter layer dielectric 15 and the insulator 17 is included in and integrated with the inter layer dielectric 18, reference numerals 16 and 17 are not shown. However, even in FIGS. 4 to 17, the insulator 16 may be formed on the lower face of the inter layer dielectric 15 and the insulator 17 may be formed on the upper face of the inter layer dielectric 18. The inter layer dielectric 15 and insulator 16 are examples of a first insulator and the inter layer dielectric 18 and insulator 17 are examples of a second insulator.

Figure 4A:
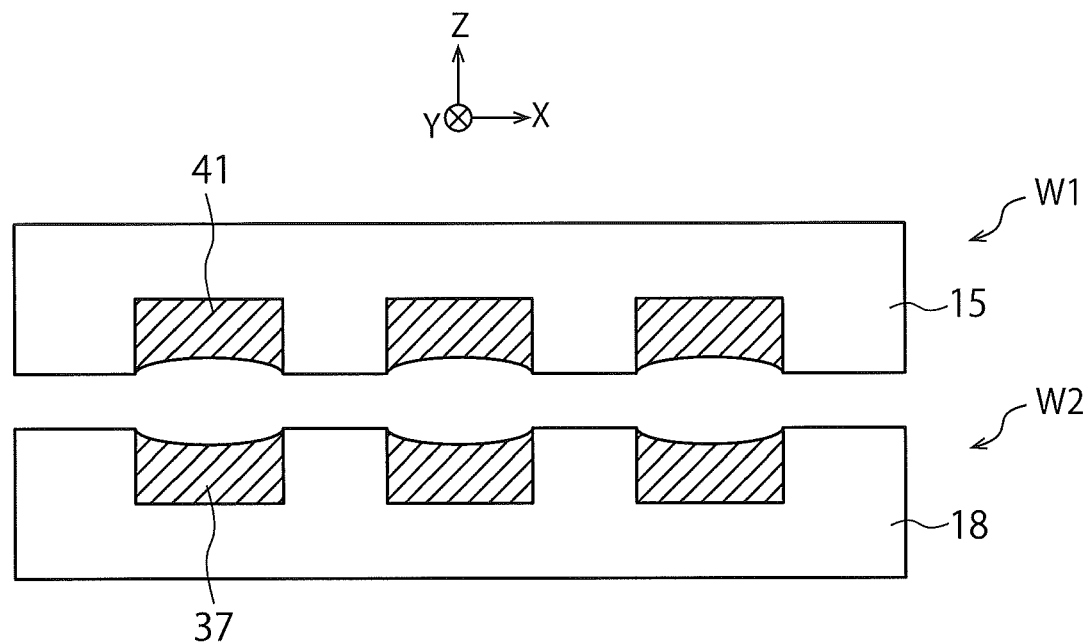
FIGS. 4A and 4B are sectional views for explaining a problem with the method of manufacturing the semiconductor device of the first embodiment.
Figure 4B:
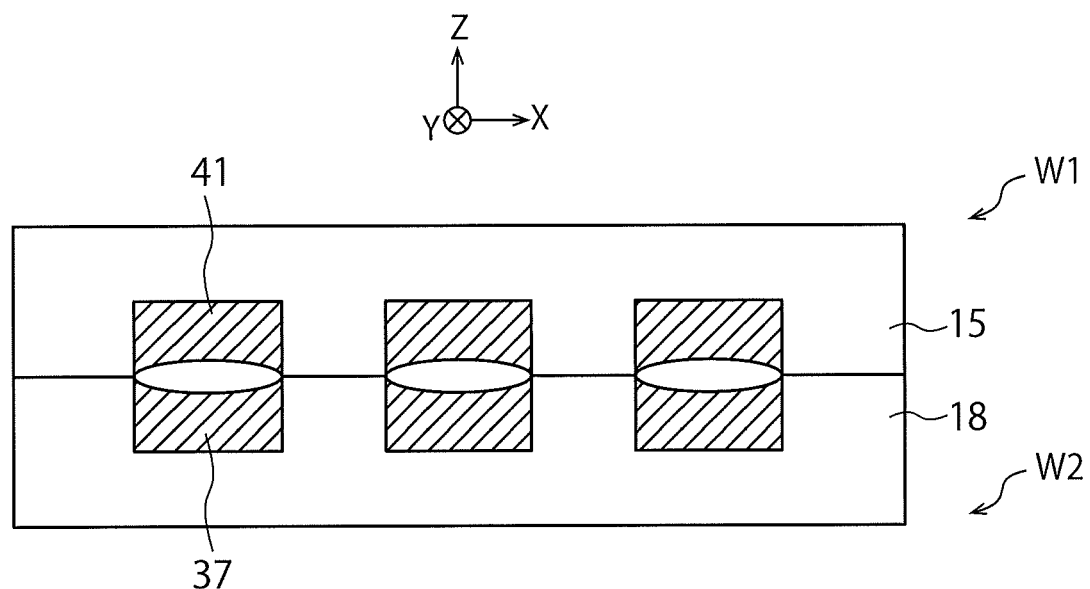

FIGS. 4A and 4B are sectional views for explaining a problem with the method of manufacturing the semiconductor device of the first embodiment.

FIG. 4A shows an array wafer W1 having plural metal pads 41 in the inter layer dielectric 15 and a circuit wafer W2 having plural metal pads 37 in the inter layer dielectric 18. The metal pad 41 is an example of a first pad and the metal pad 37 is an example of a second pad. A surface (lower face) of each metal pad 41 is depressed from a surface (lower face) of the inter layer dielectric 15. Similarly, a surface (upper face) of each metal pad 37 is depressed from a surface (upper face) of the inter layer dielectric 18.

In forming the metal pads 41, trenches are formed in the inter layer dielectric 15 and the metal pads 41 are formed by the Damascene process in the trenches. The Damascene process involves embedding a material of the metal pads 41 in the trenches and then removing the material outside the trenches by CMP. The depressions of the metal pads 41 are formed during the CMP. This is also true for the depressions of the metal pads 37.

FIG. 4B shows a process of bonding the array wafer W1 to the circuit wafer W2. When the surfaces of the metal pads 41 and 37 are depressed, the metal pads 41 may not be joined to the metal pads 37 properly. This might increase electric resistance of the metal pads 41 and 37 or cause open defects of the metal pads 41 and 37.

Figure 5A:
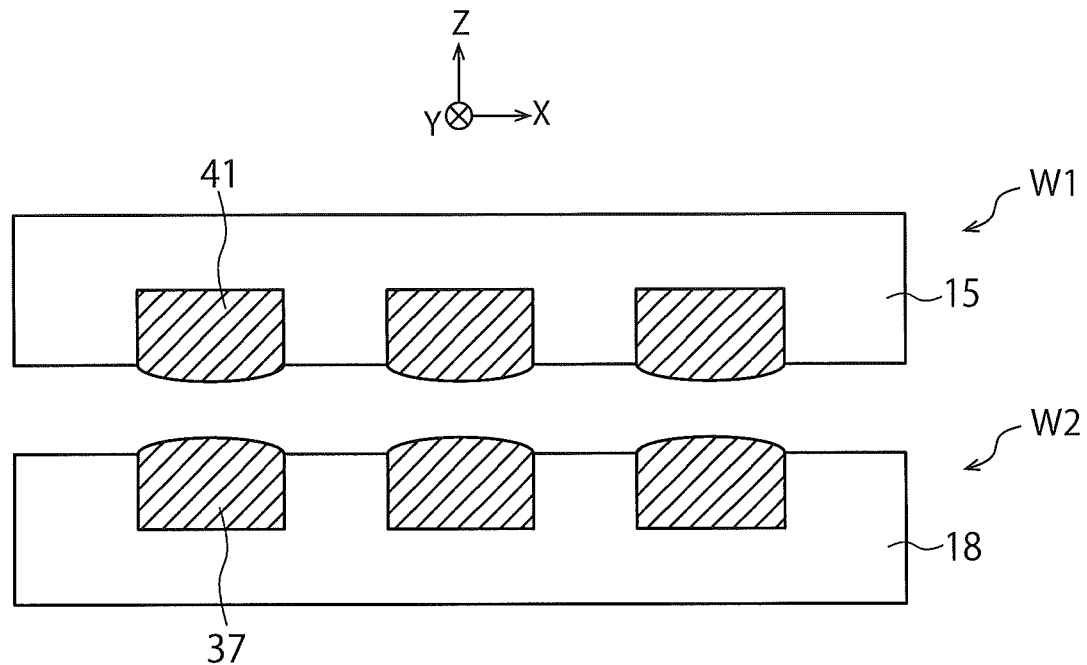
FIGS. 5A and 5B are sectional views for explaining a problem with the method of manufacturing the semiconductor device of the first embodiment.
Figure 5B:
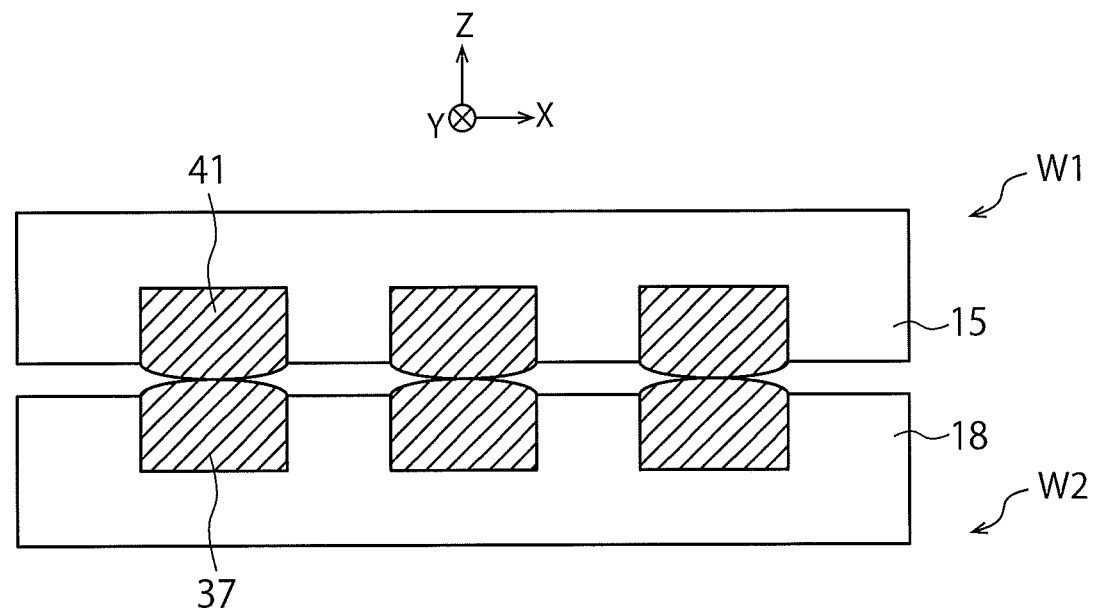

FIGS. 5A and 5B are sectional views for explaining a problem with the method of manufacturing the semiconductor device of the first embodiment.

In FIG. 5A, the surface of each metal pad 41 projects from the surface of the inter layer dielectric 15 and the surface of each metal pad 37 projects from the surface of the inter layer dielectric 18. In forming the metal pads 41 and 37, such projections may sometimes be formed.

FIG. 5B shows a process of bonding the array wafer W1 to the circuit wafer W2. When the surfaces of the metal pads 41 and 37 project, the metal pads 41 may not be joined to the metal pads 37 properly. This might increase the electric resistance of the metal pads 41 and 37.

An example of a method for dealing with these problems will be described below in the present embodiment and the second and fifth embodiments presented later.

FIGS. 6A to 8E are perspective views and sectional views showing the method of manufacturing the semiconductor device of the first embodiment.

Figure 6A:
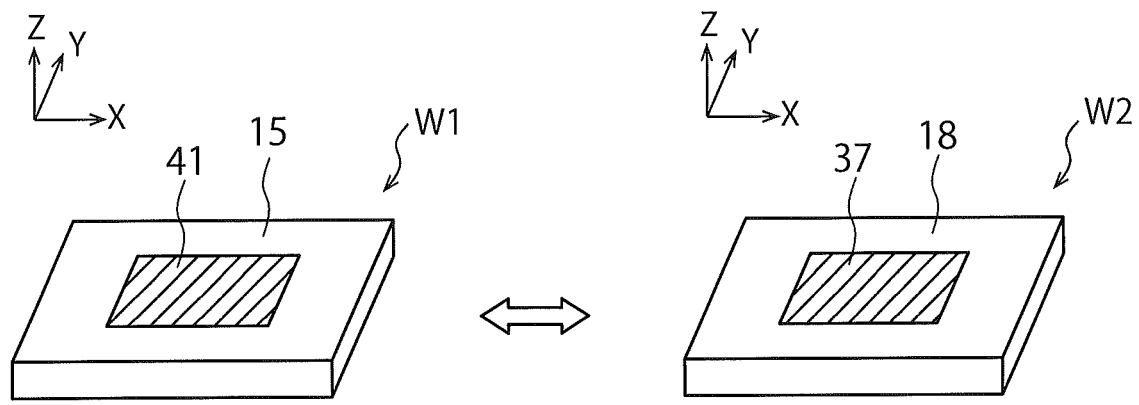
FIGS. 6A to 8E are perspective views and sectional views showing the method of manufacturing the semiconductor device of the first embodiment.

First, an array wafer W1 having metal pads 41 in the inter layer dielectric 15 and a circuit wafer W2 having metal pads 37 in the inter layer dielectric 18 are prepared (FIG. 6A). These metal pads 41 and 37 are, for example, Cu (copper) layers. The inter layer dielectrics 15 and 18 around the metal pads 41 and 37, respectively, are, for example, silicon oxide films. It should be noted that the array wafer W1 of FIG. 6A is placed such that the metal pads 41 will face upward unlike in FIG. 3 and other figures. The manufacturer who prepares the array wafer W1 and circuit wafer W2 shown in FIG. 6A may manufacture at least one of the array wafer W1 and circuit wafer W2 shown in FIG. 6A by themselves or acquire at least one of the array wafer W1 and circuit wafer W2 shown in FIG. 6A from others.

Figure 6B:
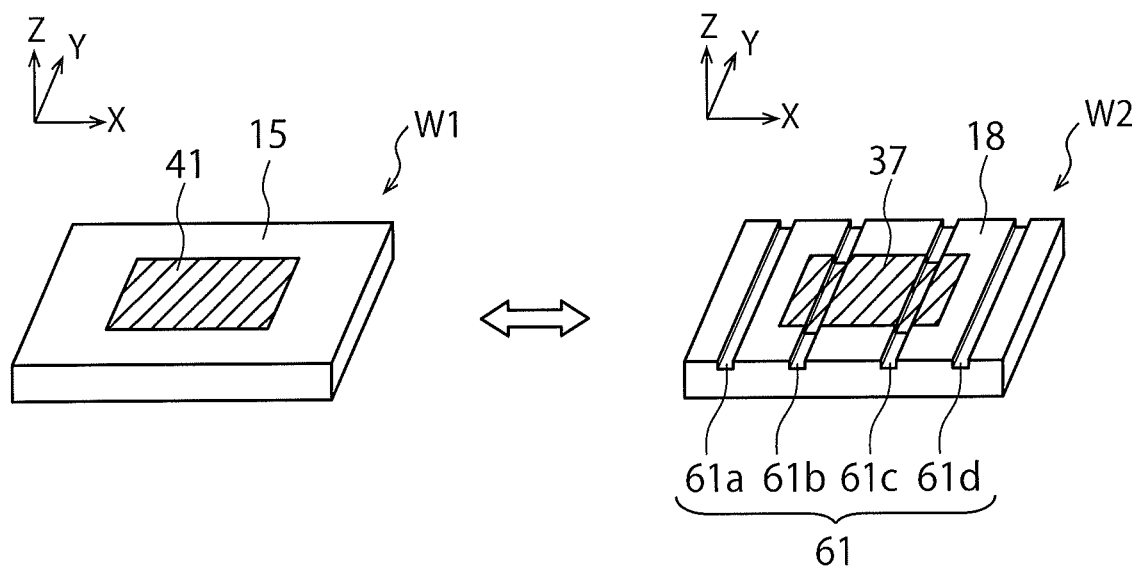

Next, plural trenches 61 are formed in the surfaces of the inter layer dielectric 18 and metal pad 37 by lithography and dry etching (FIG. 6B). FIG. 6B illustrates by example four trenches 61a to 61d extending in the Y direction by being placed next to one another in the X direction. Each of the trenches 61 extends from one end of the circuit wafer W2 to the other end of the circuit wafer W2, specifically, from one spot on an end face (bevel) of the circuit wafer W2 to another spot on the end face (bevel) of the circuit wafer W2. The trenches 61 are formed only in the circuit wafer W2 in the present embodiment, but may be formed in both the array wafer W1 and circuit wafer W2 or only in the array wafer W1. The trench 61 is an example of a cavity.

The trench 61b extends from one end of the circuit wafer W2 to the metal pad 37, passes through the surface of the metal pad 37, and extends from the metal pad 37 to the other end of the circuit wafer W2. In this way, the trench 61b is formed to extend from one end to the other end of the circuit wafer W2 through the metal pad 37, and is formed across the inter layer dielectric 18 and metal pad 37. This is also true for the trench 61c. The trenches 61b and 61c of the present embodiment are formed to such a depth as not to penetrate the metal pad 37 in the Z direction.

The trench 61a does not pass through the surface of the metal pad 37 shown in FIG. 6B, but passes through the surface of another metal pad 37 on the circuit wafer W2. Therefore, the trench 61a is also formed to be extend from one end to the other end of the circuit wafer W2 through the metal pad 37, and is formed across the inter layer dielectric 18 and metal pad 37. This is also true for the trench 61d. The trench 61a and 61d of the present embodiment are formed to the same depth as the trenches 61b and 61c.

The thickness of the metal pads 41 and 37 is, for example, 500 nm. On the other hand, the depth of each trench 61 is, for example, 30 nm. In this case, the trenches 61 have such a depth as not to penetrate the metal pad 37 in the Z direction.

Figure 7A:
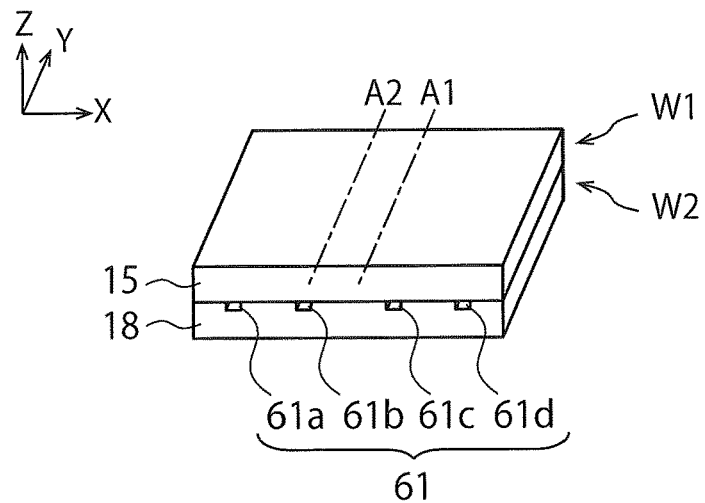
Figure 7B:
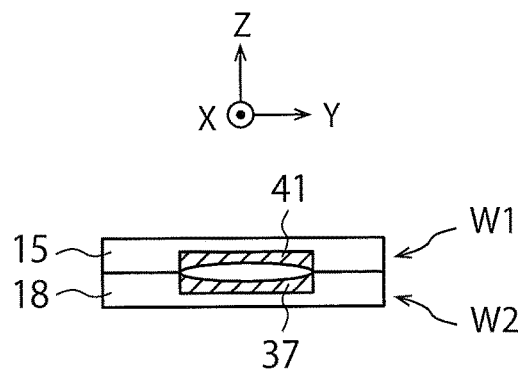
Figure 7C:
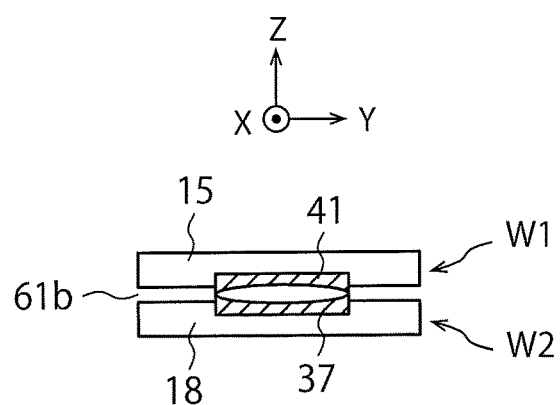

Next, the array wafer W1 is bonded to the circuit wafer W2 such that the inter layer dielectric 15 will be placed in contact with the inter layer dielectric 18 and the metal pads 41 will face the metal pads 37 (FIGS. 7A to 7C). FIG. 7B shows a cross section along line A1 in FIG. 7A and FIG. 7C shows a cross section along line A2 in FIG. 7A.

In the present process, as with the process of FIG. 3, the array wafer W1 is bonded to the circuit wafer W2 by mechanical pressure. Consequently, the inter layer dielectric 15 is adhered to the inter layer dielectric 18. On the other hand, the process of annealing the array wafer W1 and circuit wafer W2 does not need to be carried out. It should be noted that the surfaces of the metal pads 41 and 37 are depressed from the surfaces of the inter layer dielectrics 15 and 18, respectively.

In FIG. 7A, the array wafer W1 is bonded to the circuit wafer W2 such that the trenches 61 are located on the side of the inter layer dielectric 15 in the inter layer dielectric 18. As a result, the trench 61b shown in FIG. 7C passes between the lower face the metal pad 41 and an upper face the metal pad 37. This is also true for the trench 61c.

Figure 8A:
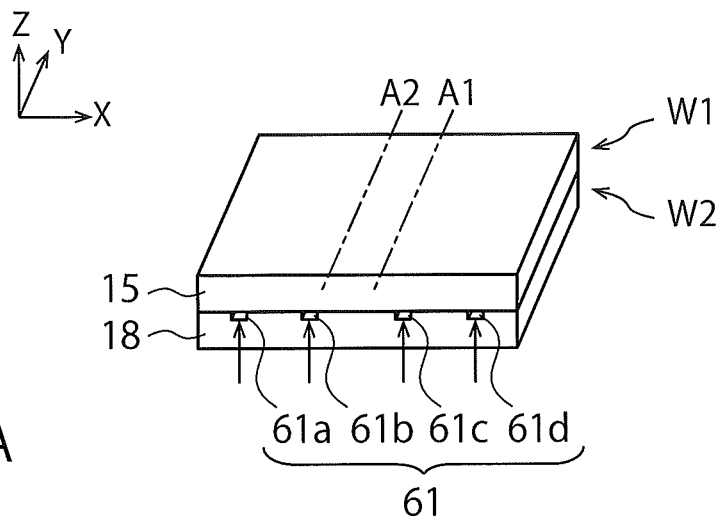
Figure 8B:
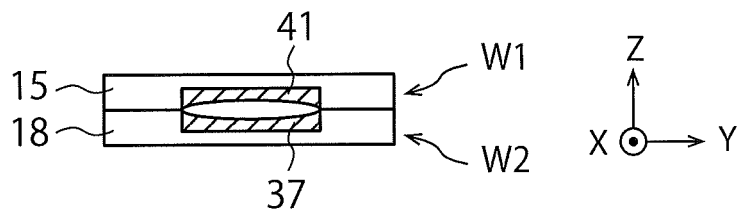
Figure 8C:
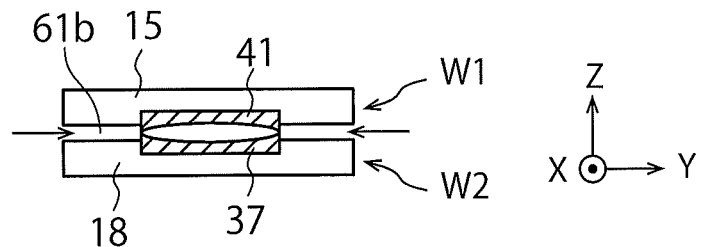
Figure 8D:
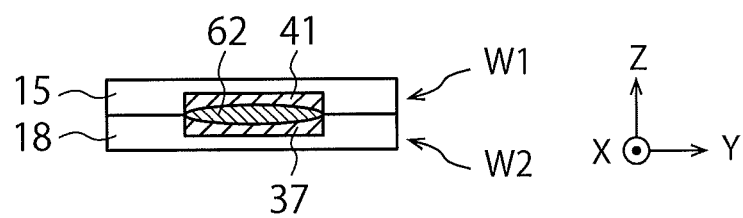
Figure 8E:
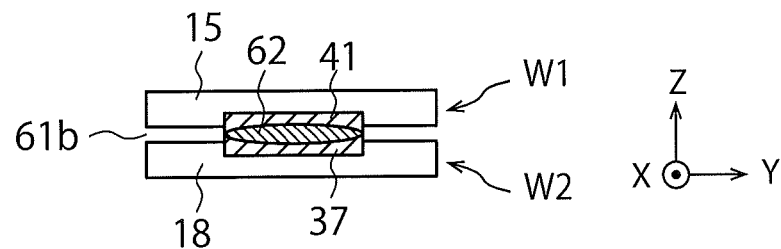

Next, a liquid (plating solution) containing a plating material is poured into a region between the metal pads 41 and 37 through the trenches 61 (FIGS. 8A to 8E). As a result, the metal pad 41 is joined to the metal pad 37 by the plating material and electrically connected to the metal pad 37 via the plating material. FIGS. 8B and 8C show cross sections along lines A1 and A2 in FIG. 8A before plating and FIGS. 8D and 8E show cross sections along lines A1 and A2 in FIG. 8A after the plating. The arrows shown in FIGS. 8A and 8C schematically indicate how the plating solution is poured through the trenches 61. According to the present embodiment, the plating solution is drawn into the trenches 61 by capillary action.

According to the present embodiment, the metal pads 41 are joined to the metal pads 37 by electroless plating using the plating solution described above. The plating material is, for example, Cu or CoWP (where Co represents cobalt and P represents phosphor). FIGS. 8D and 8E show the plating material 62 grown in a region between the metal pads 41 and 37. According to the present embodiment, the plating material 62 can be grown selectively on the surfaces of the metal pads 41 and 37 by selective electroless plating. As a result, the trenches 61 in the metal pads 37 and the regions between the metal pads 41 and 37 are embedded with the plating material 62, but the trenches 61 in the inter layer dielectric 18 remain free of the plating material 62.

After formation of the plating material 62, the trenches 61 in the inter layer dielectric 18 may be embedded with an insulating material. Examples of the insulating material includes silicon oxides and silicon nitrides. For example, the trenches 61 may be embedded with a solid insulating material by pouring a liquid insulating material into the trenches 61 in the inter layer dielectric 18 and allowing the liquid to solidify inside the trenches 61. The insulating material is an example of an insulator between the first insulator and second insulator.

Subsequently, as with the process of FIG. 3, the array wafer W1 and circuit wafer W2 are diced into plural chips. In this way, the semiconductor device of FIG. 1 is manufactured. In each of the chips resulting from the dicing, one or more trenches 61 extend from one end to the other end of the circuit chip 2, specifically, from one spot to another spot on an end face (cut surface) of the circuit chip 2. At least part of the process of the method of FIGS. 6A to 8E, e.g., the process of pouring the plating solution, may be carried out after the array wafer W1 and circuit wafer W2 are diced into plural chips.

As described above, according to the present embodiment, the trenches 61 are formed in at least one of the array wafer W1 and circuit wafer W2 and the metal pads 41 and metal pads 37 are electrically connected to each other via the plating material 62 using the trenches 61. Therefore, the present embodiment makes it possible to join the metal pads 41 to the metal pads 37 properly for example, even when the surfaces of the metal pads 41 and 37 are depressed. For example, the depressions are kept from causing increases in the electric resistance of the metal pads 41 and 37 or open defects of the metal pads 41 and 37.

The progress of the plating process using a plating solution may be controlled by a physical technique or chemical technique. For example, after the plating solution is poured into the trenches 61, growth of the plating material 62 may be started by pouring a catalyst solution into the trenches 61. Also, the progress of the plating process may be controlled by adjusting temperatures of the array wafer W1 and/or circuit wafer W2. In that case, the centers of the array wafer W1 and circuit wafer W2, which are difficult for the plating solution to reach and in which the plating material is difficult to grow, may be adjusted to higher temperatures than other parts. Also, by pouring a plating solution containing a photocatalyst into the trenches 61, the progress of the plating process may be controlled by irradiation with light.

Also, the trenches 61, which extend from one end to the other end of the circuit wafer W2 in the present embodiment, do not need to extend from one end to the other end of the circuit wafer W2. However, the trenches 61 extending from one end to the other end of the circuit wafer W2 have the advantage that air easily comes out of the regions between the metal pads 41 and 37 and out of the trenches 61 when the plating solution is poured.

Also, the plural trenches 61 of the circuit wafer W2 may include a trench 61 (dummy trench) that does not pass the surface of any of the metal pads 37. The trench 61 serving as a dummy trench is used, for example, to facilitate capillary action. The reason is that capillary action may sometimes be facilitated by increasing the density of the trenches 61.

On the circuit wafer W2 and circuit chip 2, desirably an area ratio of the trenches 61 on the upper face of the inter layer dielectric 18 is not too large. The reason is that too large an area ratio of the trenches 61 will weaken the adhesion between the inter layer dielectric 15 and inter layer dielectric 18. Therefore, desirably the area ratio of the trenches 61 on the upper face of the inter layer dielectric 18 is 50% or less. This is also true when forming trenches in the array wafer W1 or array chips 1.

As described above, the present embodiment makes it possible to electrically connect the metal pads 41 and metal pads 37 with each other in a suitable form.

Second Embodiment

FIGS. 9A to 11E are perspective views and sectional views showing a method of manufacturing a semiconductor device of a second embodiment.

Figure 9A:
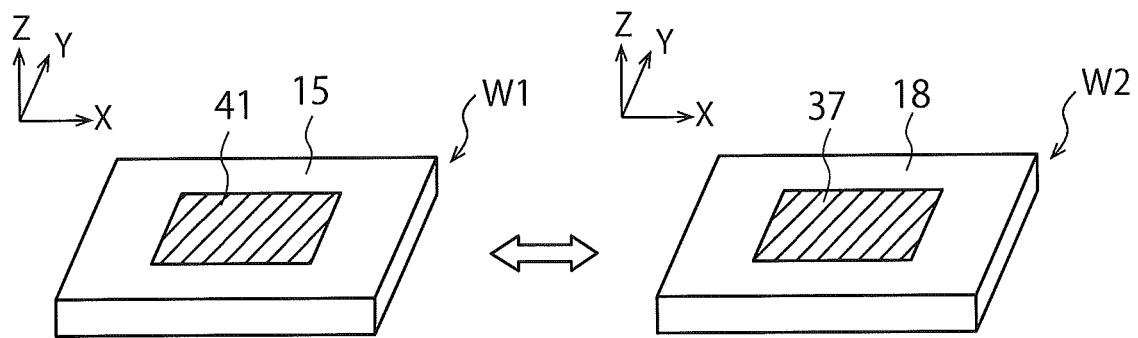
FIGS. 9A to 11E are perspective views and sectional views showing a method of manufacturing a semiconductor device of a second embodiment.

First, an array wafer W1 having metal pads 41 in the inter layer dielectric 15 and a circuit wafer W2 having metal pads 37 in the inter layer dielectric 18 are prepared (FIG. 9A). The process of FIG. 9A is carried out similarly to the process of FIG. 6A.

Figure 9B:
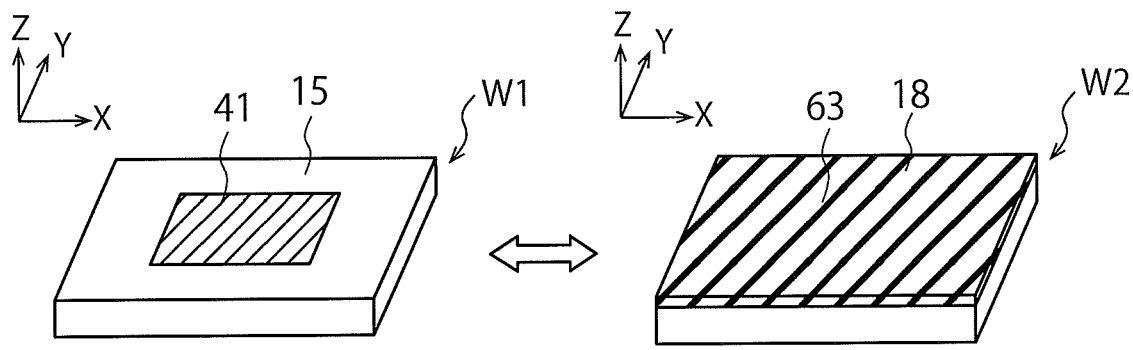

Next, a cover insulator 63 is formed on the surfaces of the inter layer dielectric 18 and metal pad 37 (FIG. 9B). The cover insulator 63 is, for example, a silicon oxide film. According to the present embodiment, the inter layer dielectric 15 is an example of the first insulator, and the inter layer dielectric 18 and cover insulator 63 are examples of the second insulator.

Figure 9C:
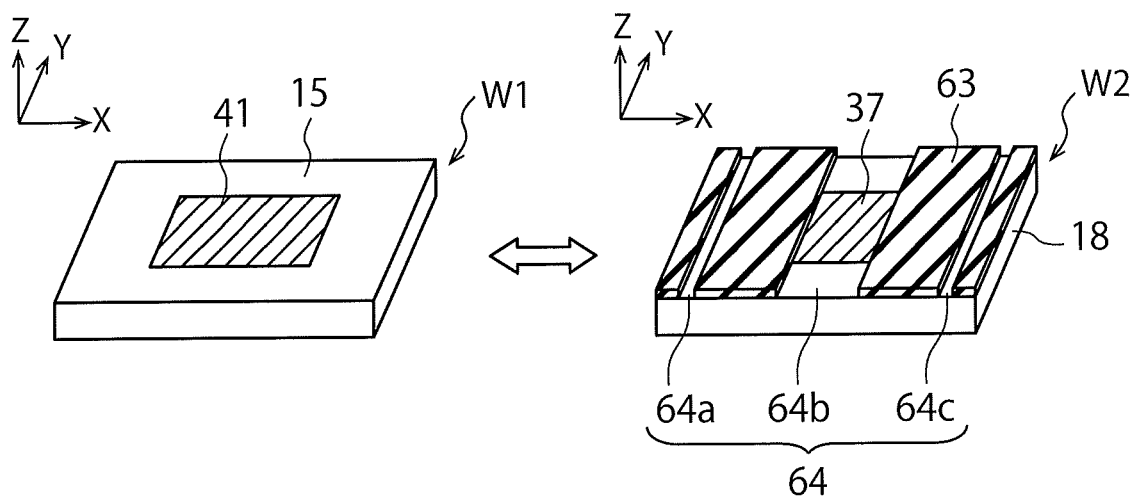

Next, plural trenches 64 are formed by lithography and dry etching, penetrating the cover insulator 63 in the Z direction (FIG. 9C). FIG. 9C illustrates by example three trenches 64a to 64c extending in the Y direction by being placed next to one another in the X direction. Each of the trenches 64 extends from one end to the other end of the circuit wafer W2, specifically, from one spot to another spot on an end face (bevel) of the circuit wafer W2. The trenches 64 are formed only in the circuit wafer W2 in the present embodiment, but may be formed in both the array wafer W1 and circuit wafer W2 or only in the array wafer W1. Each of the trenches 64 may include a portion that does not penetrate the cover insulator 63 in the Z direction or a portion that gets into the inter layer dielectric 18 or metal pad 37 by penetrating the cover insulator 63 in the Z direction. The trench 64 is an example of the cavity.

Details of the trenches 64a to 64c are generally similar to details of the trenches 61a to 61d. The thickness of the cover insulator 63 is, for example, 30 nm. The depth of each trench 64 is also 30 nm.

Figure 10A:
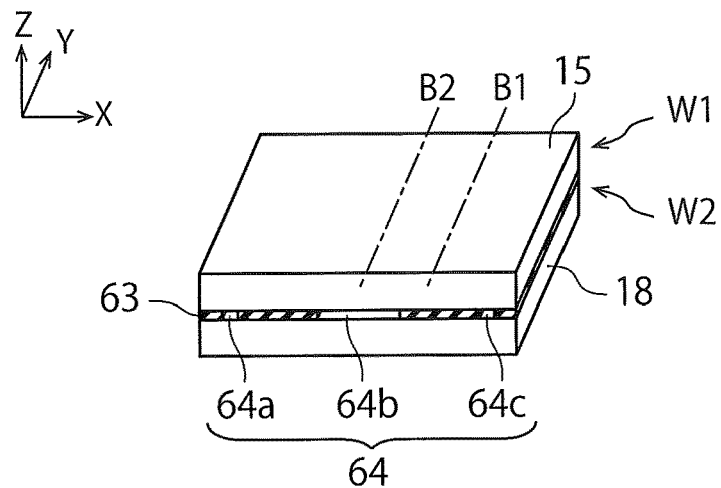
Figure 10B:
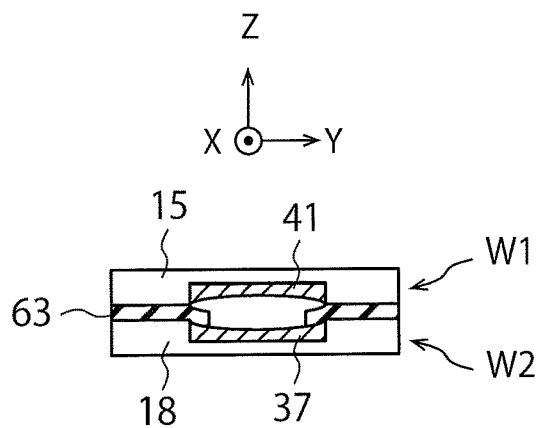
Figure 10C:
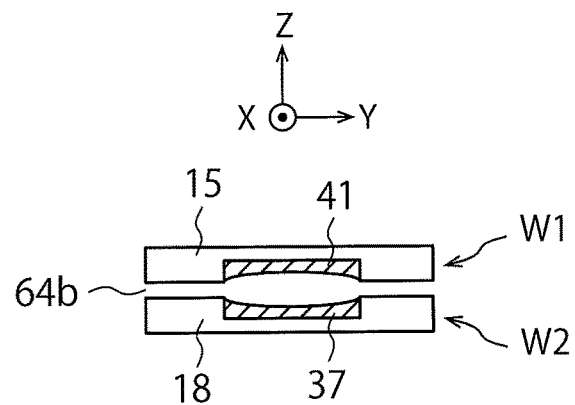

Next, the array wafer W1 is bonded to the circuit wafer W2 such that the inter layer dielectric 15 will be placed in contact with the cover insulator 63 and the metal pads 41 will face the metal pads 37 (FIGS. 10A to 10C). FIG. 10B shows a cross section along line B1 in FIG. 10A and FIG. 10C shows a cross section along line B2 in FIG. 10A. The processes of FIGS. 10A to 10C are carried out similarly to the processes of FIGS. 7A to 7C.

It should be noted that the cover insulator 63 includes a portion provided between the metal pad 41 and metal pad 37 (FIG. 10B). The reason is that the dry etching process of FIG. 9C has been carried out such that the surface of the metal pad 37 will not be exposed completely from the cover insulator 63. It should also be noted that the surfaces of the metal pads 41 and 37 are depressed from the surfaces of the inter layer dielectrics 15 and 18, respectively.

Figure 11A:
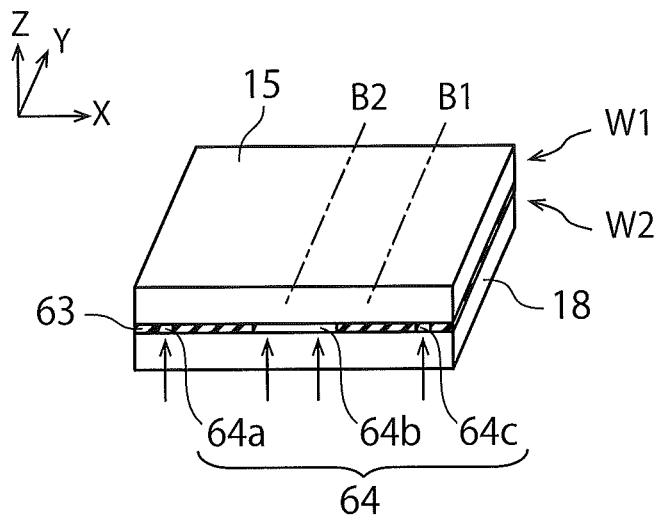
Figure 11B:
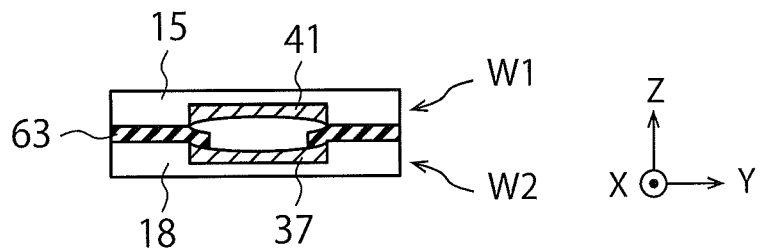
Figure 11C:
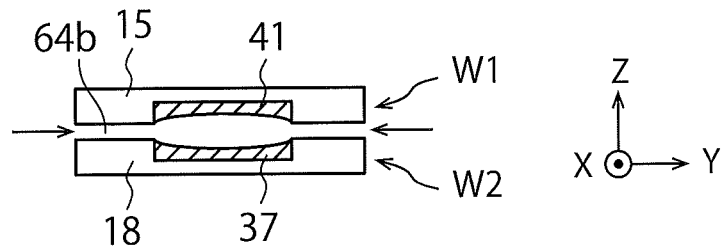
Figure 11D:
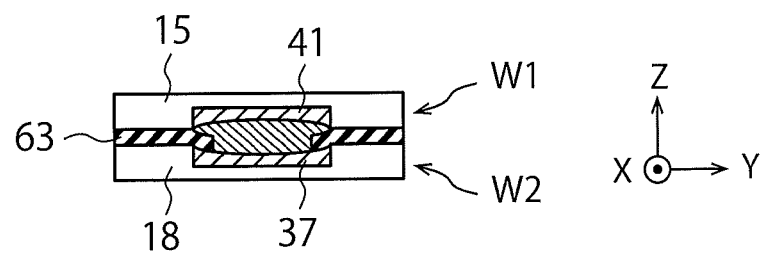
Figure 11E:
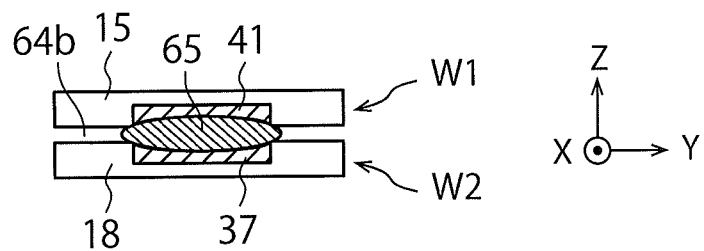

Next, a liquid (plating solution) containing a plating material is poured into a region between the metal pads 41 and 37 through the trenches 64 (FIGS. 11A to 11E). As a result, the metal pad 41 is joined to the metal pad 37 by the plating material and electrically connected to the metal pad 37 via the plating material. FIGS. 11B and 11C show cross sections along lines B1 and B2 in FIG. 11A before plating and FIGS. 11D and 11E show cross sections along lines B1 and B2 in FIG. 11A after the plating. The arrows shown in FIGS. 11A and 11C schematically indicate how the plating solution is poured through the trenches 64. According to the present embodiment, the plating solution is drawn into the trenches 64 by capillary action.

According to the present embodiment, the metal pads 41 are joined to the metal pads 37 by electroless plating using the plating solution described above. The plating material is, for example, Cu or CoWP. FIGS. 10D and 10E show the plating material 65 grown in a region between the metal pads 41 and 37. According to the present embodiment, the plating material 65 can be grown selectively on the surfaces of the metal pads 41 and 37 by selective electroless plating. As a result, the trenches 64 in the metal pads 37 and the regions between the metal pads 41 and 37 are embedded with the plating material 65, but the trenches 64 in the cover insulator 63 (and in the inter layer dielectric 18) remain free of the plating material 65.

After formation of the plating material 65, the trenches in the cover insulator 63 may be embedded with an insulating material. Examples of the insulating material includes silicon oxides and silicon nitrides. For example, the trenches 64 may be embedded with a solid insulating material by pouring a liquid insulating material into the trenches 64 in the cover insulator 63 and allowing the liquid to solidify inside the trenches 64. The insulating material is an example of the insulator between the first insulator and second insulator.

Subsequently, as with the process of FIG. 3, the array wafer W1 and circuit wafer W2 are diced into plural chips. In this way, the semiconductor device of FIG. 1 is manufactured. In each of the chips resulting from the dicing, one or more trenches 64 extend from one end of the circuit chip 2 to the other end of the circuit chip 2, specifically, from one spot on an end face (cut surface) of the circuit chip 2 to another spot on the end face (cut surface) of the circuit chip 2. At least part of the process of the method of FIGS. 9A to 11E, e.g., the process of pouring the plating solution, may be carried out after the array wafer W1 and circuit wafer W2 are diced into plural chips.

In the process of FIG. 9B, the cover insulator 63 may be formed on the surfaces of the inter layer dielectric 15 and metal pad 41 rather than on the surfaces of the inter layer dielectric 18 and metal pad 37. In that case, the inter layer dielectric 15 and cover insulator 63 are examples of the first insulator, and the inter layer dielectric 18 is an example of the second insulator.

Also, in the process of FIG. 9B, a first cover insulator may be formed on the surfaces of the inter layer dielectric 15 and metal pad 41 and a second cover insulator 63 may be formed on the surfaces of the inter layer dielectric 18 and metal pad 37. In that case, the inter layer dielectric 15 and first cover insulator 63 are examples of the first insulator, and the inter layer dielectric 18 and second cover insulator 63 are examples of the second insulator.

Figure 12:
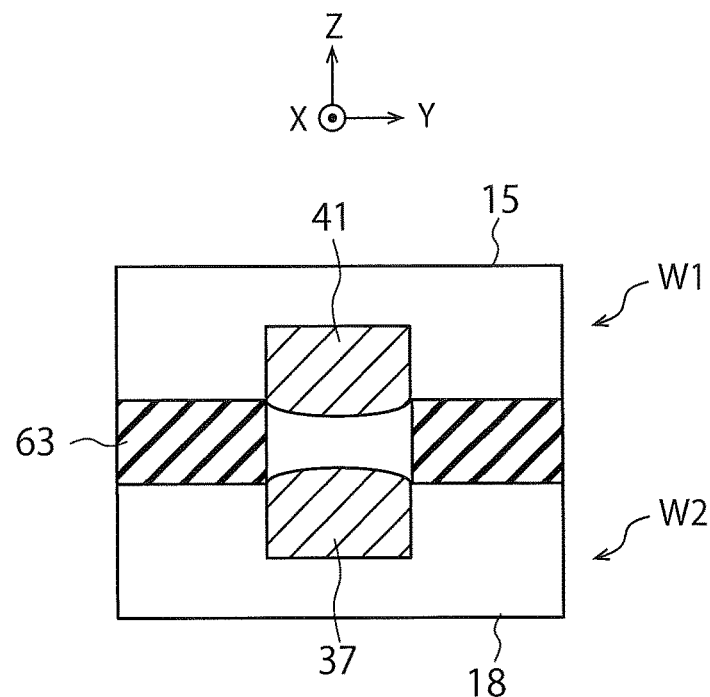
FIG. 12 is a sectional view showing a method of manufacturing a semiconductor device of a variation of the second embodiment.

FIG. 12 is a sectional view showing a method of manufacturing a semiconductor device of a variation of the second embodiment.

Figure 13:
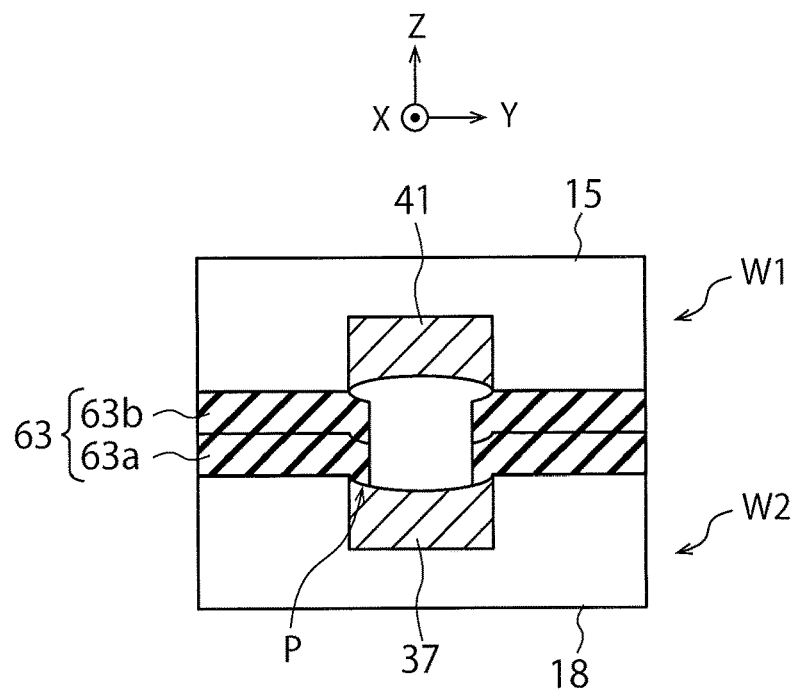
FIG. 13 is a sectional view showing a method of manufacturing a semiconductor device of another variation of the second embodiment.

FIG. 12 corresponds to the sectional view of FIG. 11B. In FIG. 12, the surfaces of the metal pads 41 and 37 project from the surfaces of the inter layer dielectrics 15 and 18, respectively. Since the circuit wafer W2 of the present embodiment includes the cover insulator 63, even if the metal pads 41 and 37 project, a gap is created between the metal pads 41 and 37. By growing the plating material 65 in the gap, the present embodiment makes it possible to join the metal pads 41 to the metal pads 37 using the plating material 65. FIG. 13 is a sectional view showing a method of manufacturing a semiconductor device of another variation of the second embodiment.

FIG. 13 also corresponds to the sectional view of FIG. 11B. The cover insulator 63 of FIG. 13 includes a cover insulator 63a formed on the surfaces of the inter layer dielectric 18 and metal pad 37 and a cover insulator 63b formed on the cover insulator 63a and placed in contact with the inter layer dielectric 15.

Reference character P denotes a contact surface between the cover insulator 63a and metal pad 37. When the metal pad 37 is a Cu layer, the metal pad 37 is less prone to being adhered to silicon oxide films and prone to being adhered to silicon nitride films. Therefore, the cover insulator 63a of the present variation is a silicon oxide film.

On the other hand, when the inter layer dielectric 15 is a silicon oxide film, the inter layer dielectric 15 is prone to being adhered to a silicon nitride film at the time of bonding. Therefore, the cover insulator 63b of the present variation is a silicon nitride film.

As described above, according to the present embodiment, the cover insulator 63 and trenches 64 are formed on at least one of the array wafer W1 and circuit wafer W2 and the metal pads 41 and metal pads 37 are electrically connected via the plating material 65 using the trenches 64. Therefore, the present embodiment makes it possible to join the metal pads 41 to the metal pads 37 properly, for example, even when the surfaces of the metal pads 41 and 37 are depressed or projected. For example, the depressions and projections are kept from causing increases in the electric resistance of the metal pads 41 and 37 and the depressions are kept from causing open defects of the metal pads 41 and 37.

Third Embodiment

Figure 14A:
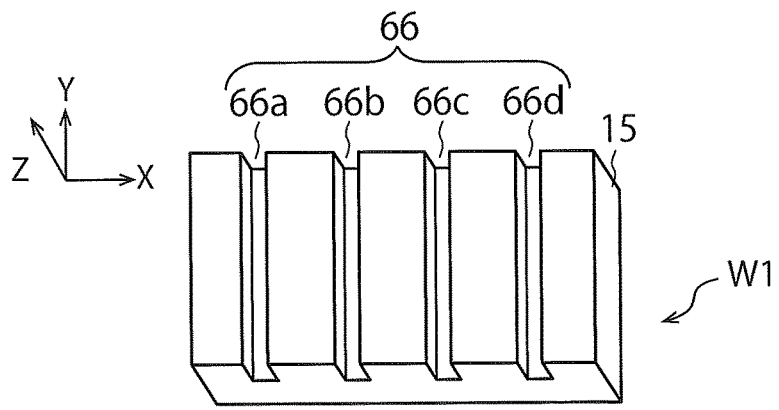
FIGS. 14A to 14C are perspective views and a sectional view showing a method of manufacturing a semiconductor device of a third embodiment.
Figure 14B:
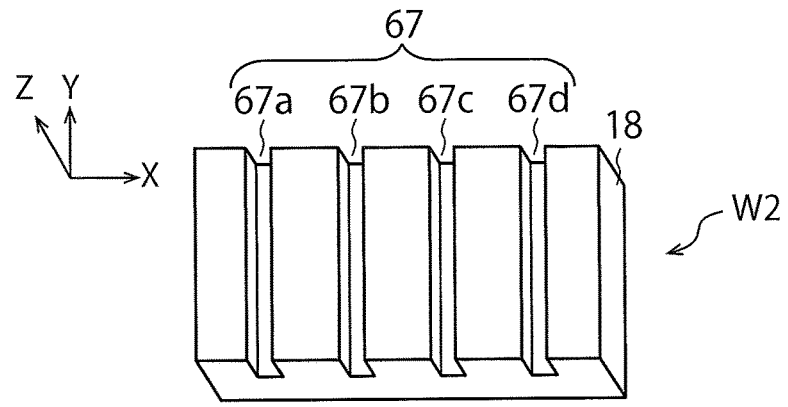
Figure 14C:
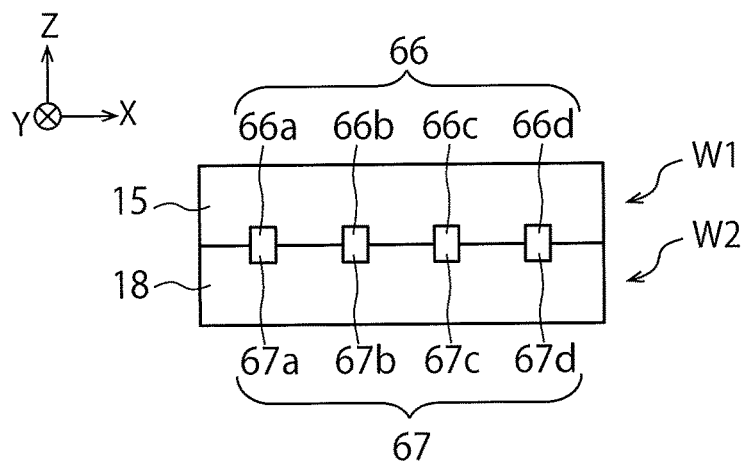

FIGS. 14A to 14C are perspective views and a sectional view showing a method of manufacturing a semiconductor device of a third embodiment.

FIG. 14A shows plural trenches 66 (66a to 66d) formed in the inter layer dielectric 15 of the array wafer W1. FIG. 14B shows plural trenches 67 (67a to 67d) formed in the inter layer dielectric 18 of the array wafer W2. Both the trenches 66 and 67 extend in the Y direction by passing through surfaces of metal pads 37 and 41 (not shown). Details of the trenches 66 and 67 are generally similar to details of the trenches 61. The trenches 66 and 67 are examples of the cavity.

FIG. 14C shows the array wafer W1 bonded to the circuit wafer W2. Each trench 66 of the present embodiment is in contact with the corresponding trench 67, i.e., located right above the corresponding trench 67. In other words, each trench 66 of the present embodiment is provided to overlap with the corresponding trench 67 in the Z direction. As a result, one trench 67 and one trench 66 form one thicker trench. FIG. 14C illustrates by example four thicker trenches formed by the four trenches 66a to 66d and four trenches 67a to 67d. The present embodiment makes it easy to pour the plating solution into thick trenches and release air from the thick trenches. The Z direction is an example of a third direction.

The trenches 66 are fully in contact with the corresponding trenches 67, but may be only partially in contact with the corresponding trenches 67. In that case, the trenches may extend in parallel to, or not in parallel to, the corresponding trenches 67.

Fourth Embodiment

Figure 15A:
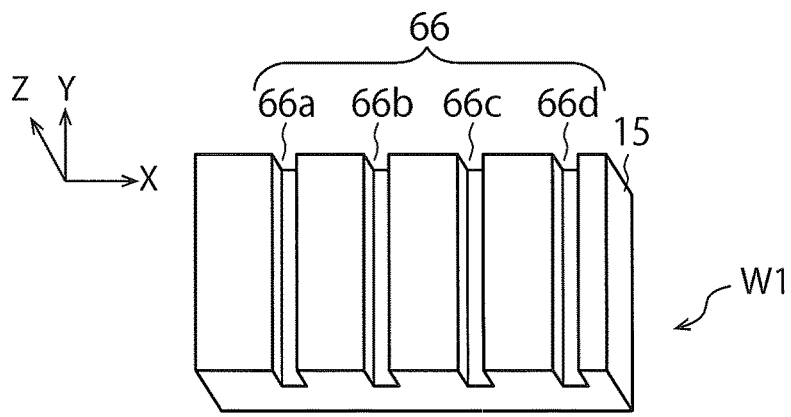
FIGS. 15A to 15C are perspective views and a sectional view showing a method of manufacturing a semiconductor device of a fourth embodiment.
Figure 15B:
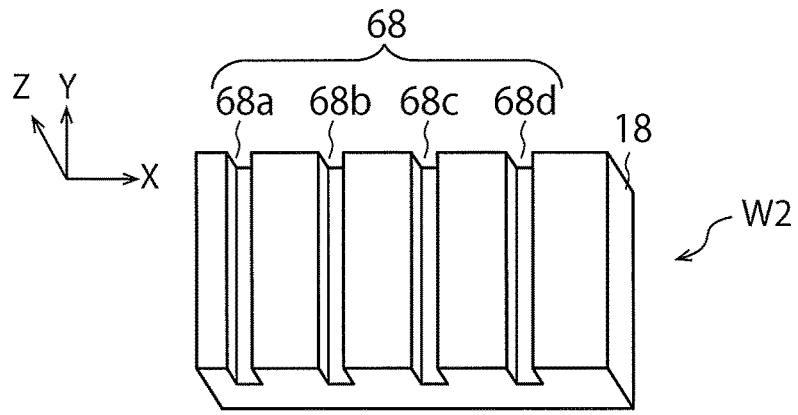
Figure 15C:
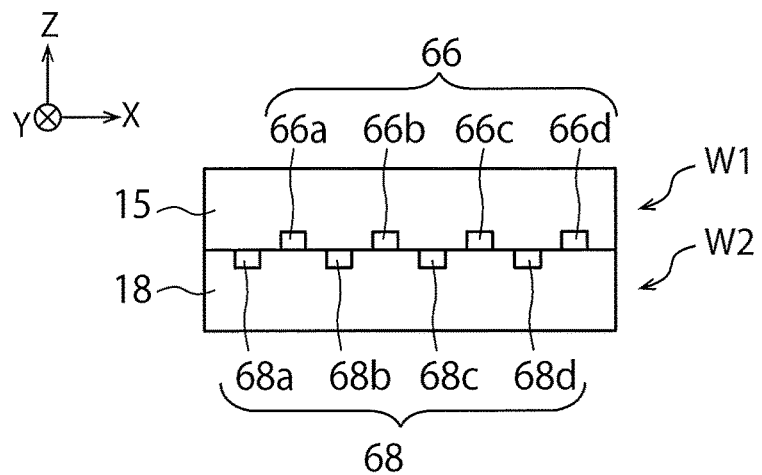

FIGS. 15A to 15C are perspective views and a sectional view showing a method of manufacturing a semiconductor device of a fourth embodiment.

FIG. 15A shows plural trenches 66 (66a to 66d) formed in the inter layer dielectric 15 of the array wafer W1 as with FIG. 14A. FIG. 15B shows plural trenches 68 (68a to 68d) formed in the inter layer dielectric 18 of the array wafer W1. Both the trenches 66 and 68 extend in the Y direction by passing through surfaces of metal pads 37 and 41 (not shown). Details of the trenches 66 and 68 are generally similar to details of the trenches 61. The trenches 66 and 68 are examples of the cavity.

FIG. 15C shows the array wafer W1 bonded to the circuit wafer W2. Each trench 66 of the present embodiment is placed not to be in contact with any one of the trenches 68, and is provided not to overlap any one of the trenches 68 in the Z direction. Specifically, each trench 66 is located between trenches 68 adjacent with each other, and each trench 68 is located between trenches 66 adjacent with each other. Therefore, the present embodiment can make the density of the trenches of the present embodiment as high as the trenches 61 of the first embodiment using an inexpensive lithographic apparatus. This makes it easy to pour the plating solution into the trenches and release air from the trenches.

The trenches 67 of the third embodiment and trenches 68 of the fourth embodiment may be formed in the cover insulator 63 of the second embodiment rather than in the inter layer dielectric 18.

Fifth Embodiment

Figure 16:
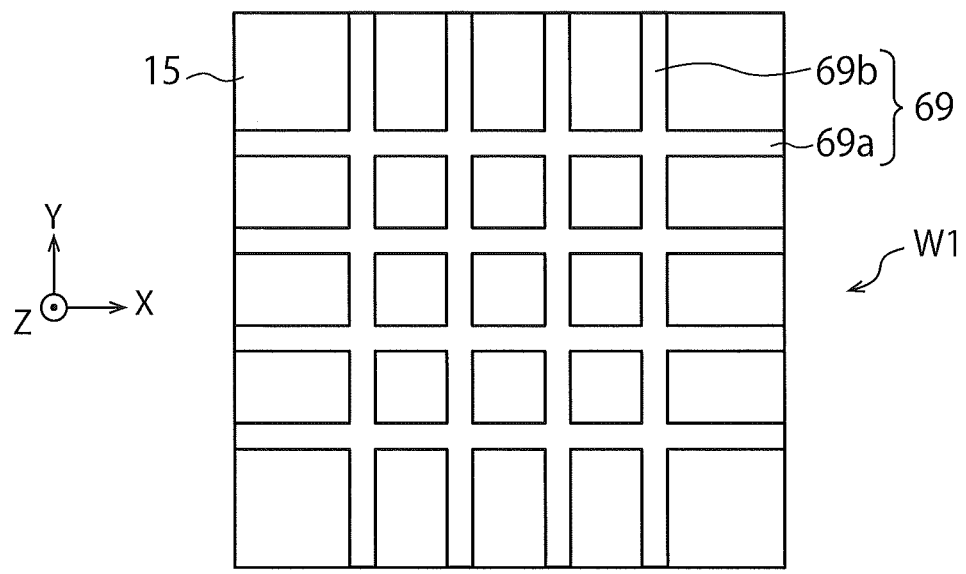
FIG. 16 is a sectional view showing a method of manufacturing a semiconductor device of a fifth embodiment.

FIG. 16 is a sectional view showing a method of manufacturing a semiconductor device of a fifth embodiment.

FIG. 16 shows one trench 69 formed in the inter layer dielectric 15 of the array wafer W1. The trench 69 includes plural first portions 69a extending in the X direction, and plural second portions 69b in contact with the first portions 69a and extending in the Y direction. The X direction is an example of a first direction and Y direction is an example of a second direction. The trench 69 is an example of the cavity.

In this way, according to the present embodiment, the trench 69 including portions that extend in plural directions is formed. This makes it easy to pour the plating solution into the trench 69 and release air from the trench 69.

Figure 17:
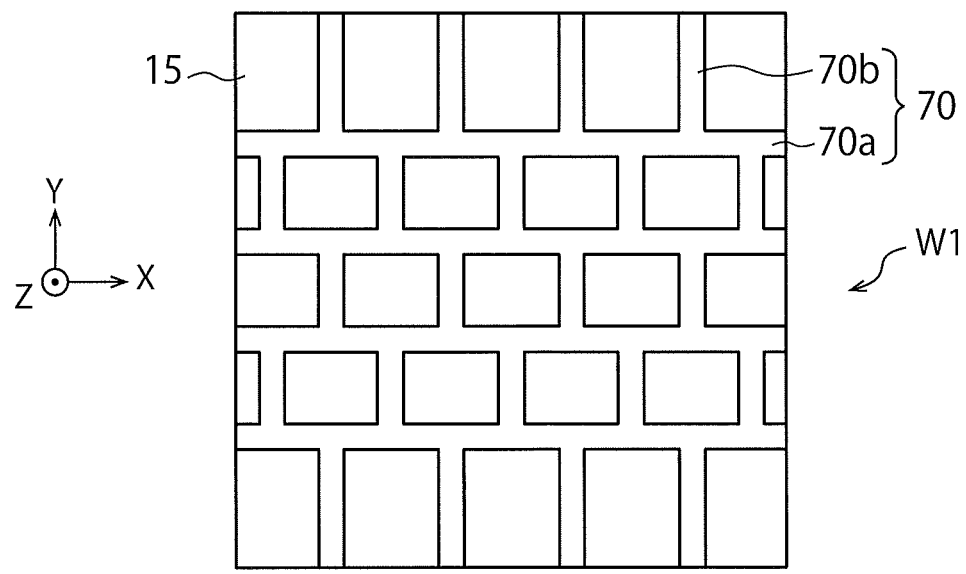
FIG. 17 is a sectional view showing a method of manufacturing a semiconductor device of a variation of the fifth embodiment.

FIG. 17 is a sectional view showing a method of manufacturing a semiconductor device of a variation of the fifth embodiment.

FIG. 17 shows one trench 70 formed in the inter layer dielectric 15 of the array wafer W1. This trench 70 includes plural first portions 70a extending in the X direction, and plural second portions 70b in contact with the first portions 70a and extending in the Y direction. In other words, the second portions 70b are coupled to the first portions 70a. The trench 70 is an example of the cavity.

As with the trench 69, the trench 70 includes portions extending in plural directions. However, while intersections between the first and second portions 69a, 69b in FIG. 16 are cross-shaped, intersections between the first and second portions 70a, 70b in FIG. 17 are T-shaped. Consequently, the plating solution and air in the trench 70 flow differently from the plating solution and air in the trench 69. Therefore, a preferred one of the trenches 69 and 70 may be adopted according to the purposes.

In the present embodiment, a trench may or may not be formed in the inter layer dielectric 18 or cover insulator 63 of the circuit wafer W2. When a trench is formed in the inter layer dielectric 18 or cover insulator 63 of the circuit wafer W2, a trench (69 or 70) may or may not be formed in the inter layer dielectric 15 of the array wafer W1.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first wafer or a first chip including a first insulator having a first surface, and a first pad provided in the first insulator and including a first depressed portion that is depressed from the first surface; and
a second wafer or a second chip including a second insulator having a second surface that is in contact with the first surface, and a second pad provided in the second insulator, opposed to the first pad, and including a second depressed portion that is depressed from the second surface,
wherein
a plating material is provided between the first depressed portion and the second depressed portion, and electrically connecting the first pad to the second pad, and
the first insulator includes a first trench provided on the first surface, and extending from a first end of the first wafer or the first chip to the first pad, and/or
the second insulator includes a second trench provided on the second surface, and extending from a second end of the second wafer or the second chip to the second pad.

2. The device of claim 1, wherein
the first trench is provided on the first surface of the first insulator and on a surface of the first pad; and/or
the second trench is provided on the second surface of the second insulator and on a surface of the second pad.

3. The device of claim 1, wherein the first trench extends from the first end of the first wafer or file first chip to a third end of the first water or the first chip via the first pad; and/or
the second trench extends from the second end of the second wafer or the second chip to a fourth end of the second wafer or the second chip via the second pad.

4. The device of claim 1, wherein when the first insulator includes a plurality of trenches that are provided on the first surface and include the first trench, a ratio of an area of the plurality of trenches of the first insulator to an area of the first surface of the first insulator is 50% or less; and/or
when the second insulator includes a plurality of trenches that are provided on the second surface and include the second trench, a ratio of an area of the plurality of trenches of the second insulator to an area of the second surface, of the second insulator is 50% or less.

5. The device of claim 1, wherein at least one of the first trench and the second trench includes a first portion that extends in a first direction and a second portion that is coupled to the first portion and extends in a second direction different from the first direction.

6. The device of claim 1, wherein the first insulator includes the first trench, and the second insulator includes the second trench.

7. The device of claim 6, wherein the second trench extends in parallel to the first trench.

8. The device of claim 6, wherein
the second insulator is located in a third direction of the first insulator, and
the second trench is provided to overlap with at least a portion of the first trench in the third direction.

9. The device of claim 6, wherein
the second insulator is located in a third direction of the first insulator, and
the second trench is provided not to overlap with the first trench in the third direction.

10. A method of manufacturing a semiconductor device, comprising:
preparing a first wafer or a first chip including a first insulator having a first surface, and a first pad provided in the first insulator and including a first depressed portion that is depressed from the first surface; and
preparing a second wafer or a second chip including a second insulator having a second surface, and a second pad provided in the second insulator and including a second depressed portion that is depressed from the second surface;
forming a first trench provided on the first surface and extending from a first end of the first wafer or the first chip to the first pad in the first insulator, and/or forming a second trench provided on the second surface and extending from a second end of the second wafer or the second chip to the second pad in the second insulator;
bonding the first water or the first chip to the second water or the second chip such that the first surface is in contact with the second surface and the first pad is opposed to the second pad; and providing a plating material between the first depressed portion and the second depressed portion to electrically connect the first pad to the second pad.

11. The method of claim 10, further comprising pouring a liquid that includes the plating material from the first trench and/or the second trench into a region between the first pad and the second pad to electrically connect the first pad to the second pad via the plating material.

12. The method of claim 10, wherein the first trench is formed on the first surface of the first insulator and on a surface of the first pad; and/or the second trench is formed on the second surface of the second insulator and on a surface of the second pad.

13. The method of claim 10, wherein the first trench is formed to extend from the first end of the first water or the first chip to a third end of the first wafer or the first chip via the first pad; and/or the second trench is formed to extend from the second end of the second wafer or the second chip to a fourth end of the second wafer or the second chip via the second pad.

14. The method of claim 10, wherein the first trench is formed in the first insulator, and the second trench is formed in the second insulator.

15. The method of claim 10, wherein at least one of the first trench and the second trench includes a first portion that extends in a first direction and a second portion that is coupled to the first portion and extends in a second direction different from the first direction.

* * * * *